US008183634B2

(12) United States Patent
Park et al.

(10) Patent No.: US 8,183,634 B2
(45) Date of Patent: May 22, 2012

(54) STACK-TYPE SEMICONDUCTOR DEVICE

(75) Inventors: Jun-Beom Park, Seoul (KR); Soon-Moon Jung, Gyeonggi-do (KR); Han-Soo Kim, Gyeonggi-do (KR); Jae-Hoon Jang, Gyeonggi-do (KR); Jae-Hun Jeong, Gyeonggi-do (KR); Jong-In Yun, Seoul (KR); Mi-So Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 212 days.

(21) Appl. No.: 12/536,775

(22) Filed: Aug. 6, 2009

(65) Prior Publication Data

US 2010/0032762 A1 Feb. 11, 2010

(30) Foreign Application Priority Data

Aug. 6, 2008 (KR) ........................ 10-2008-0076798

(51) Int. Cl.
*H01L 27/12* (2006.01)

(52) U.S. Cl. .. 257/350; 257/314; 257/774; 257/E27.112

(58) Field of Classification Search .................. 257/314, 257/350, 774, E27.112
See application file for complete search history.

(56) References Cited

U.S. PATENT DOCUMENTS

| | | | | |
|---|---|---|---|---|
| 6,424,011 | B1 | 7/2002 | Assaderaghi et al. | |
| 2002/0036330 | A1 * | 3/2002 | Kobayashi | 257/407 |
| 2006/0108627 | A1 * | 5/2006 | Choi et al. | 257/314 |

FOREIGN PATENT DOCUMENTS

| | | |
|---|---|---|
| JP | 2006-261178 | 9/2006 |
| KR | 10-0807980 | 2/2008 |

* cited by examiner

*Primary Examiner* — Benjamin Sandvik
*Assistant Examiner* — Whitney T Moore
(74) *Attorney, Agent, or Firm* — Myers Bigel Sibley & Sajovec, P.A.

(57) ABSTRACT

A stack-type semiconductor device and a method of manufacturing the same are provided. The stack-type semiconductor device includes an insulation layer on a single-crystalline substrate, a contact plug penetrating the insulation layer to contact the single-crystalline substrate, an upper semiconductor pattern including an impurity region and a gate structure positioned between the impurity regions on the upper semiconductor pattern. An upper surface of the contact plug contacts a lower surface of the semiconductor pattern. An operation failure of the stack-type semiconductor device is reduced since the upper semiconductor pattern is electrically connected to the single-crystalline semiconductor substrate.

13 Claims, 16 Drawing Sheets

STACK-TYPE SEMICONDUCTOR DEVICE

REFERENCE TO PRIORITY APPLICATION

This application claims priority under 35 U.S.C. § 119 to Korean Patent Application No. 2008-76798, filed on Aug. 6, 2008, in the Korean Intellectual Property Office (KIPO), the contents of which are hereby incorporated herein by reference in their entirety.

BACKGROUND

1. Field

Example embodiments relate to a stack-type semiconductor device and a method of manufacturing the same. More particularly, example embodiments relate to a stack-type semiconductor device including a transistor and a method of manufacturing the same.

2. Description of the Related Art

Generally, semiconductor devices may include various metal oxide semiconductor (MOS) transistors operating with different operation characteristics and having different electrical characteristics.

Recently, a method of forming the MOS transistor vertically stacked on a substrate has been developed to highly increase the degrees of integration of the semiconductor devices. However, it is difficult to manufacture the MOS transistors vertically stacked on a substrate have operation characteristics substantially the same as the MOS transistors formed on the substrate. Therefore, a new method of manufacturing a highly-integrated stack-type semiconductor device with excellent operation characteristics may be required.

SUMMARY

Example embodiments provide a high integration stack-type semiconductor device having improved operation characteristics.

Example embodiments provide a method of manufacturing a highly-integrated stack-type semiconductor device having improved operation characteristics.

According to some example embodiments, there is provided a stack-type semiconductor device. In the stack-type semiconductor device, a first insulating interlayer is provided on a single-crystalline semiconductor substrate. A first contact plug penetrating the first insulating interlayer is provided to contact the single-crystalline semiconductor substrate. An upper semiconductor pattern including an impurity region is provided on the first insulating interlayer. An upper surface of the first contact plug contacts a lower surface of the upper semiconductor pattern. A gate structure positioned adjacent to the impurity region is provided on the upper semiconductor pattern.

In an example embodiment, a plurality of the upper semiconductor patterns may be provided and an insulation layer is interposed between the upper semiconductor patterns.

In an example embodiment, cell transistors may be provided on the single-crystalline substrate to serve as a cell array.

In an example embodiment, an upper transistor included in a peripheral circuit may be provided on the upper semiconductor pattern. The upper transistor may include an impurity region and a gate structure.

In an example embodiment, the upper transistor may have an operating voltage substantially different from that of a cell transistor.

In an example embodiment, a first lower transistor serving as a cell array and a second lower transistor serving as a peripheral circuit may be provided on the single-crystalline semiconductor substrate.

In an example embodiment, a plurality of the upper semiconductor patterns may be provided. An upper transistor provided on the upper semiconductor pattern may include a first upper transistor serving as a cell array and a second upper transistor serving as a peripheral circuit.

In an example embodiment, a second insulating interlayer covering the upper semiconductor pattern may be provided. A second contact plug penetrating the second insulating interlayer may be provided to be electrically connected to the impurity region of the upper semiconductor pattern.

In an example embodiment, a wiring electrically may be connected to the single-crystalline semiconductor substrate such that an electrical signal may be applied to the upper semiconductor pattern through the first contact plug.

In an example embodiment, the first contact plug may include polysilicon doped with impurities, metal and metal compound.

In an example embodiment, the upper semiconductor pattern may include single-crystalline semiconductor material.

According to other example embodiments, there is provided a method of manufacturing a stack-type semiconductor device. In the method, a first insulating interlayer is formed on a single-crystalline semiconductor substrate. A first contact plug penetrating the first insulating interlayer is formed to be electrically connected to the single-crystalline semiconductor substrate. An upper semiconductor pattern is formed on the first insulating interlayer to contact an upper surface of the contact plug. An upper transistor including an impurity region and a gate structure are formed on the upper semiconductor pattern.

In an example embodiment, an upper single-crystalline semiconductor substrate may be attached to the first insulating interlayer. An upper portion of the upper single-crystalline semiconductor substrate may be planarized to form an upper semiconductor layer. The upper semiconductor layer may be patterned to form the upper semiconductor pattern.

In an example embodiment, a cell transistor serving as a cell array may be provided on the single-crystalline semiconductor substrate.

In an example embodiment, the upper transistor may include a gate insulation layer having a thickness substantially different from that of a gate insulation layer included in the cell transistor.

In an example embodiment, a first lower transistor serving as a cell array and a second lower transistor serving as a peripheral circuit may be formed on the single-crystalline semiconductor substrate.

In an example embodiment, a plurality of the upper semiconductor patterns may be formed. A first upper transistor serving as a cell array may be formed on some the upper semiconductor patterns. A second upper transistor serving as a peripheral circuit may be formed on other the upper semiconductor patterns.

In an example embodiment, a portion of the first insulating interlayer may be etched to form a contact hole exposing a surface of the other the single-crystalline semiconductor substrate. A conductive material may be filled in the contact hole to form the first contact plug.

In an example embodiment, the first contact plug may include polysilicon doped with impurities, metal and metal compound.

In an example embodiment, a second insulating interlayer covering the upper semiconductor pattern may be formed. A second contact plug penetrating the second insulating interlayer may be formed to be electrically connected to the impurity region of the upper transistor.

According to still other example embodiments, there is provided a stack-type semiconductor device. In the stack-type semiconductor device, a semiconductor substrate having a first string of NAND-type memory cells therein is provided. An interlayer insulating layer is provided on said semiconductor substrate. A single-crystal semiconductor layer is provided on said interlayer insulating layer. Said single-crystal semiconductor layer having a second string of NAND-type memory cells therein extends opposite the first string of NAND-type memory cells. An electrically conductive contact plug extends through said interlayer insulating layer. An electrically conductive contact plug electrically connects a region in said semiconductor substrate to a region in said single-crystal semiconductor layer.

In an example embodiment, said electrically conductive contact plug may electrically shorts said semiconductor substrate to said single-crystal semiconductor layer.

According to example embodiments, a bulk portion of an upper semiconductor pattern is electrically connected to a single-crystalline substrate. Since the upper semiconductor pattern is not electrically separated, a deterioration of unit elements by self heating of the unit elements may be prevented during operating the unit elements provided on the upper semiconductor pattern. Thus, electrical properties of the unit elements provided on the upper semiconductor pattern may be improved.

In addition, a peripheral circuit including a high voltage transistor may be formed on the upper semiconductor pattern. Thus, it is possible to modify various configurations of the stack-type semiconductor device.

Further, since each of the upper semiconductor patterns may have an isolated pattern shape, it is possible to electrically isolate each of the upper semiconductor patterns even though the upper semiconductor pattern is spaced apart from adjacent upper semiconductor patterns at a relatively narrow distance. Thus, the stack-type semiconductor device according to the example embodiment may be highly integrated.

BRIEF DESCRIPTION OF THE DRAWINGS

Example embodiments will be more clearly understood from the following detailed description taken in conjunction with the accompanying drawings.

FIG. 1 is a cross-sectional view illustrating a stack-type semiconductor device in accordance with Embodiment 1.

FIG. 2 is a plan view illustrating the stack-type semiconductor device in accordance with Embodiment 1.

FIGS. 3 to 9 are cross-sectional views illustrating a method of forming the stacked transistor in FIG. 1.

FIG. 10 is a cross-sectional view illustrating a stacked non-volatile memory device in accordance with Embodiment 2.

FIG. 11 is a block diagram illustrating elements provided on the upper semiconductor pattern in FIG. 10.

FIGS. 12 to 19 are cross-sectional views illustrating a method of forming a stacked non-volatile memory device in accordance with Embodiment 2.

DETAILED DESCRIPTION OF THE EMBODIMENTS

Figure 1:
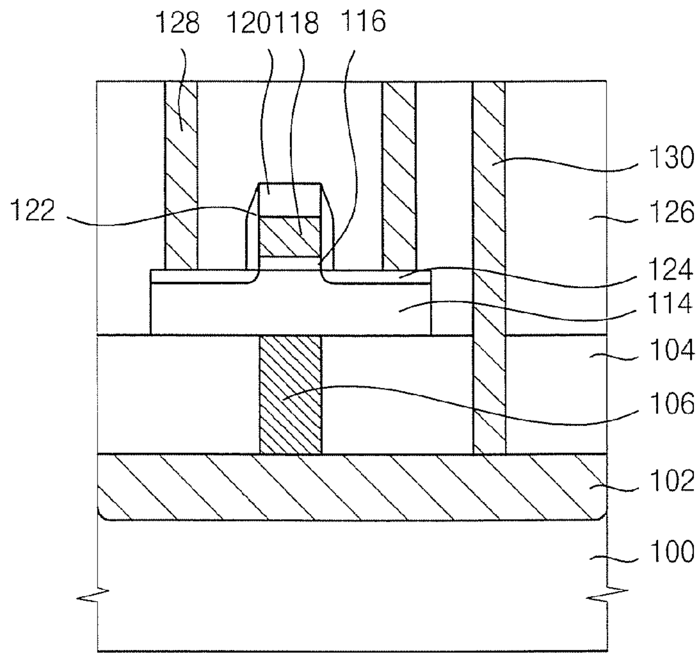
FIGS. 1 to 17 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
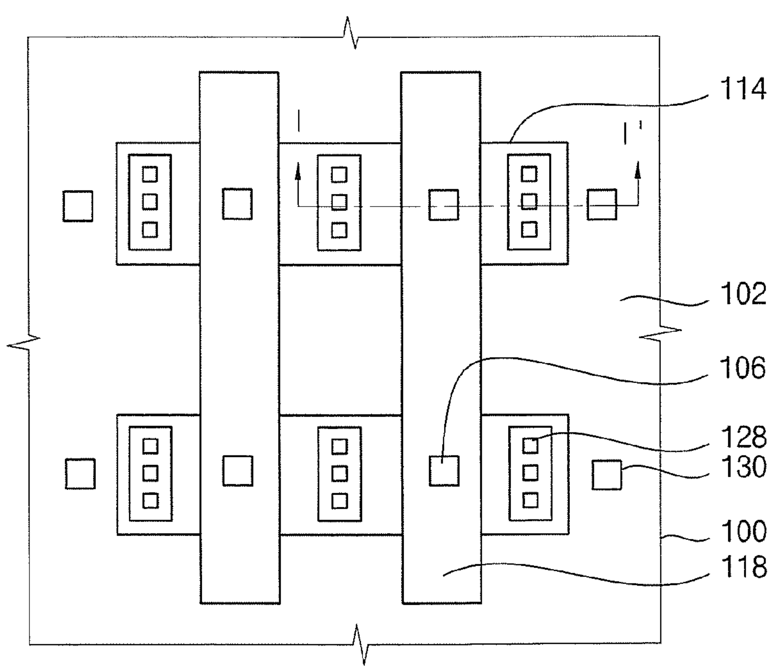

FIG. 1 is a cross-sectional view illustrating a stack-type semiconductor device in accordance with an embodiment of the invention. FIG. 2 is a plan view illustrating the stack-type semiconductor device in accordance with the embodiment of FIG. 1. FIG. 1 is a cross-sectional view taken along the line I-I' in FIG. 2. Referring to FIGS. 1 and 2, a single-crystalline semiconductor substrate 100 is provided. The single-crystalline substrate 100 may include a single-crystalline silicon substrate. Although it is not illustrated in the figures, lower structures such as a transistor may be provided on the single-crystalline semiconductor substrate 100. A first insulating interlayer 104 is provided on the single-crystalline semiconductor substrate 100. The first insulating interlayer 104 may include silicon oxide. The first insulating interlayer 104 may have a flat upper surface. A first contact plug 106 is provided to penetrate the first insulating interlayer 104 to contact the single-crystalline semiconductor substrate 100. An upper surface of the first contact plug 106 may be coplanar with the upper surface of the first insulating interlayer 104. The first contact plug 106 may include polysilicon doped with impurities. The impurities may have a conductive type opposite to that of a source/drain of an upper transistor. For example, when the upper transistor is an n-type transistor, the first contact plug 106 may include polysilicon doped with p-type impurities. Alternatively, the first contact plug 106 may include metal and/or metal compound. A well 102 is provided under a surface of the single-crystalline semiconductor substrate 100 contacting the first contact plug 106. The well 102 may be doped with impurities having a conductive type opposite to that of the source/drain of the upper transistor.

At least one upper semiconductor pattern 114 may be provided on the first insulating interlayer 104 to contact the first contact plug 106. A lower surface of each of the upper semiconductor patterns 114 may contact an upper surface of a respective contact plug 106. Accordingly, the lower surface of the upper semiconductor pattern 114 may be electrically connected to the single-crystalline semiconductor substrate 100 by the first contact plug 106. The upper semiconductor pattern 114 may have a flat upper surface. The upper semiconductor pattern 114 may include single-crystalline semiconductor material. For example, the upper semiconductor pattern 114 may include the single-crystalline silicon.

The upper semiconductor pattern 114 may have an isolated shape. In other words, the upper surface of the first insulating interlayer 104 may be exposed from both sides of the upper semiconductor pattern 114. The upper semiconductor pattern 114 may serve as an active region. The upper semiconductor pattern 114 may have a thickness of about 300□ to about 4000□. Since the upper semiconductor pattern 114 may have the isolated shape, the upper semiconductor pattern may be electrically insulated from adjacent upper semiconductor patterns even though an additional isolation layer pattern is not provided.

At least one upper transistor may be provided on the upper semiconductor pattern 114. The upper transistor may include a gate insulation layer 116, a gate electrode 118 and a source/drain region 124. The source/drain region 124 may be provided in the upper semiconductor pattern 114. The gate insulation layer 116 and the gate electrode 118 may be sequentially stacked on the upper semiconductor pattern 114 between the source/drain regions 124. A bottom surface of the source/drain region 124 may be positioned higher than the lower surface of the upper semiconductor pattern 114. Alternatively, the bottom surface of the source/drain region 124 may extend to the lower surface of the upper semiconductor pattern 114.

A hard mask pattern 120 may be provided on the gate electrode 118. A spacer 122 may be provided on sidewalls of the hard mask pattern 120 and the gate electrode 118. The upper transistor may include a high voltage transistor having an operation voltage of more than about 10V.

A second insulating interlayer 126 is provided to cover the upper semiconductor pattern 114. The second insulating interlayer 126 may have a flat upper surface.

A second contact plug 128 is provided to penetrate the second insulating interlayer 126 to contact the source/drain region 124 of the upper transistor.

A third contact plug 130 is provided to penetrate the second insulating interlayer 126 and the first insulating interlayer 104 to contact the surface of the single-crystalline semiconductor substrate 100. A conductive line (not illustrated) may be provided on the second insulating interlayer 126 to be electrically connected to the third contact plug 130. An electrical signal may be applied to the single-crystalline semiconductor substrate 100 through the conductive line and the third contact plug 130. Accordingly, the electrical signal applied to the single-crystalline semiconductor substrate 100 may be applied to the upper semiconductor pattern 114 through the first contact plug 106.

In a conventional stack-type semiconductor device, an upper semiconductor pattern may have a relatively thin thickness and be in an electrical floating state by an underlying insulation layer. Thus, a current leakage may flow in the transistor formed on the upper semiconductor pattern due to holes accumulated by hot carriers. In addition, an operation failure of the conventional stack-type semiconductor device may occur frequently because a threshold voltage is decreased due to the accumulated holes. In case that a high voltage transistor is formed the upper semiconductor pattern, the upper semiconductor pattern may be overheated by repeated operations, so that an insulation breakdown of the high voltage transistor may be generated. Thus, it is difficult to form the high voltage transistor on the upper semiconductor pattern with a relatively high reliability.

Further, in the conventional stacked semiconductor, a trench isolation pattern may be provided in the upper semiconductor pattern in order not to float the upper semiconductor pattern. However, the process of forming the trench isolation pattern in the upper semiconductor pattern may be not easily implemented since the upper semiconductor pattern has a relatively thin thickness. In addition, the trench isolation pattern may be required to have a relatively greater width in order to decrease breakdown voltage of the transistor formed on the upper semiconductor pattern. Thus, a relatively greater area may be required to form the trench isolation pattern, thereby decreasing the integration degree of the semiconductor device.

On the other hands, the upper semiconductor pattern according to example embodiments may be electrically connected to the single-crystalline semiconductor substrate through the contact plug. That is, even though the upper semiconductor pattern has the isolated shape, the upper semiconductor pattern may be not electrically floated to be electrically connected the underlying the single-crystalline semiconductor substrate. Therefore, the holes generated by the hot carriers may be emitted through the single-crystalline semiconductor substrate and may be not accumulated in the upper semiconductor pattern. Accordingly, the operation failures generated by accumulated holes may be prevented. In addition, even though the high voltage transistor is formed on the upper semiconductor pattern, the high voltage transistor formed on the upper semiconductor pattern may operate normally.

Further, since the upper semiconductor pattern has the isolated pattern, isolation characteristics between the adjacent upper semiconductor patterns may be improved and an additional isolation region may be not required for isolation. Thus, the integration degree of the semiconductor device may be highly increased.

FIGS. 3 to 9 are cross-sectional views illustrating a method of forming the stacked transistor in FIG. 1.

Figure 3:
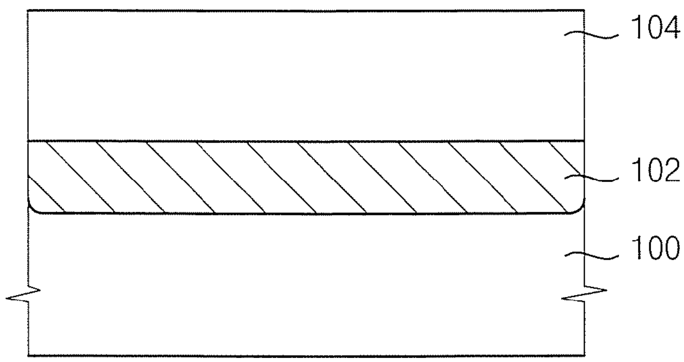

Referring to FIG. 3, a single-crystalline semiconductor substrate 100 is provided. The substrate 100 may include single-crystalline silicon substrate. Although it is not illustrated in the figure, lower structures such as a transistor may be formed on the single-crystalline substrate 100.

Impurities are doped under a surface of the single-crystalline semiconductor substrate 100. The well 102 may be electrically connected to a bulk portion of an upper semiconductor pattern 114 to be formed by a following process. The well 102 may be doped with impurities having a conductive type opposite to that of source/drain of an upper transistor formed on the upper semiconductor pattern.

A first insulating interlayer 104 is formed on the single-crystalline semiconductor substrate 100. The first insulating interlayer 104 may be formed by a deposition process such as a chemical vapor deposition (CVD) process. The first insulating interlayer 104 may include silicon oxide.

When the lower structure is formed on the single-crystalline semiconductor substrate 100, an upper surface of the first insulating interlayer 104 may have a relatively rough surface. In this case, a chemical mechanical polishing (CMP) process may be performed to planarize the upper portion of the first insulating interlayer 104.

Figure 4:
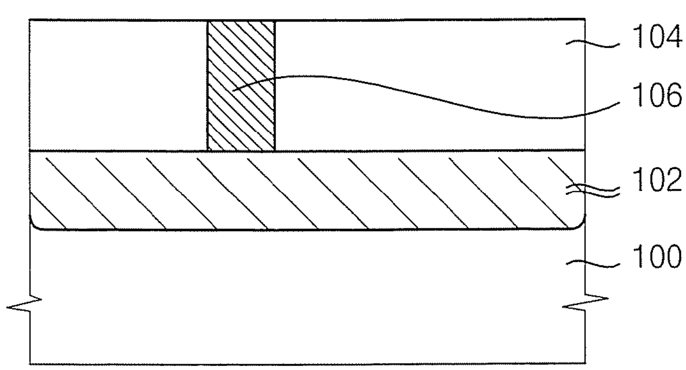

Referring to FIG. 4, an etching mask pattern (not illustrated) may be formed on the first insulating interlayer 104. The etching mask pattern may include a photoresist pattern formed using a photolithography process.

The first insulating interlayer 104 may be etched using the etching mask pattern to form a first contact hole exposing the surface of the single-crystalline substrate 100. A bottom surface of the first contact hole may expose a portion of an upper surface of the well 102.

A conductive layer is deposited on the first insulating interlayer 104 to fill the first contact hole. The conductive layer may be formed using polysilicon doped with impurities, a metal and/or a metal compound. For example, a barrier metal layer including titanium (Ti)/titanium nitride (TiN) and a metal layer including tungsten (W) may be sequentially deposited to form the conductive layer. Alternatively, polysilicon doped with impurities having a conductive type the same as that of the well 102 may be deposited to form the conductive layer.

The conductive layer may be planarized until the first insulating interlayer 104 is exposed, to form a first contact plug 106 that is electrically connected to the well 102 of the single-crystalline substrate 100. For example, the conductive layer may be planarized by a CMP process.

Figure 5:
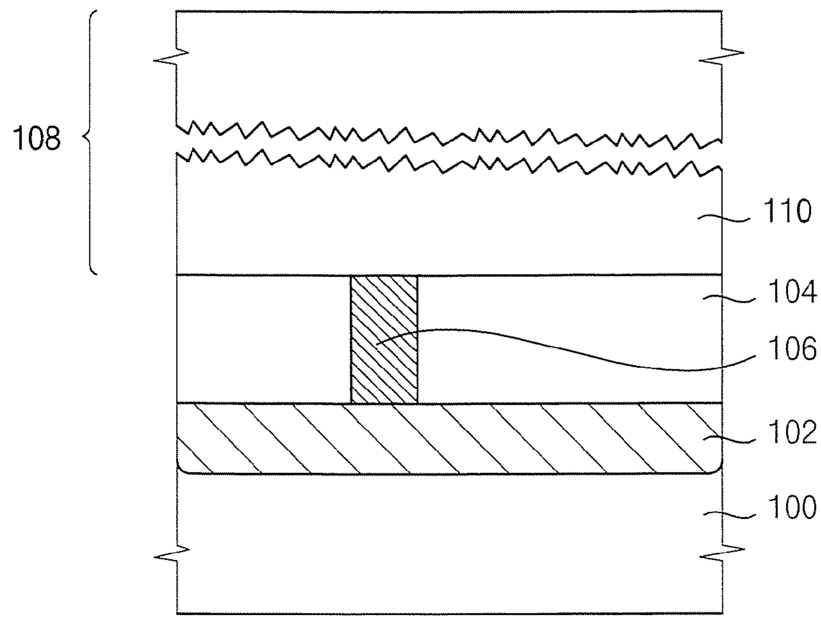

Referring to FIG. 5, an upper single-crystalline semiconductor substrate 108 may be formed on the first insulating interlayer 104. The upper single-crystalline semiconductor substrate may include single-crystalline semiconductor material. For example, the upper single-crystalline semiconductor substrate may include a single-crystalline silicon substrate. An upper portion of the upper single-crystalline semiconductor substrate 108 may be separated from the single-crystalline semiconductor substrate 108 to form a preliminary upper semiconductor layer 110.

Hereinafter, a method forming the preliminary upper semiconductor layer 110 will be described. First, a hydrogen ion implantation process may be performed on a surface of the upper single-crystalline semiconductor substrate 108 that is used as a donor substrate. Hydrogen ions may be implanted into a portion of the upper single-crystalline semiconductor substrate 108 that is spaced apart from the surface of the upper single-crystalline semiconductor substrate 108, to form a cutting region. The upper single-crystalline semiconductor substrate 108 may be the single-crystalline semiconductor layer 110.

A cleaning process may be performed on the upper single-crystalline semiconductor substrate 108 on which the hydrogen implantation process is performed and on the single-crystalline semiconductor substrate 100 including the first insulating interlayer 104 formed thereon, respectively. The cleaning process may be performed to remove particles remaining on the surface of the upper single-crystalline semiconductor substrate 108 and the surface of the single-crystalline semiconductor substrate 100.

After the first insulating interlayer 104 and the upper single-crystalline semiconductor substrate 108 are aligned to each other, the upper surface of the first insulating interlayer 104 may make contact with the surface of the upper single-crystalline semiconductor substrate 108.

Then, a thermal treatment may be performed on the upper single-crystalline semiconductor substrate 108 and the first insulating interlayer 104 attached to each other, so that the upper portion of the upper single-crystalline semiconductor substrate 108 may be separated from the upper single-crystalline semiconductor substrate 108 along the cutting region. A portion of the upper single-crystalline semiconductor substrate 108 remaining on the upper surface of the first insulating interlayer 104 may serve as the preliminary upper semiconductor layer 110. The thermal treatment for separating the upper portion of the upper single-crystalline semiconductor substrate 108 may be carried out at a temperature of about 300□ to about 700□.

As the portion of the upper single-crystalline semiconductor substrate 108 is separated along the cutting region by the thermal treatment, a bonding strength at an interface between the surface of the upper single-crystalline semiconductor substrate 108 and the upper face of the first insulating interlayer 104 may be increased. Further, damages caused by the hydrogen ions in the upper single-crystalline semiconductor substrate 108 during the ion implantation process may be removed.

Figure 6:
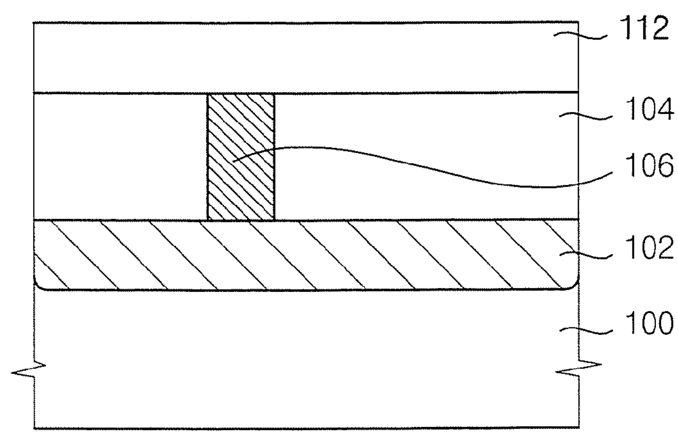

Referring to FIG. 6, a planarization process may be performed on the preliminary upper semiconductor layer 110 to form an upper semiconductor layer 112. For example, the preliminary upper semiconductor layer 100 may be planarized by a CMP process. The upper semiconductor layer 112 may have a flat upper surface. The upper semiconductor layer 112 may have a thickness of about 300□ to about 4000□.

Figure 7:
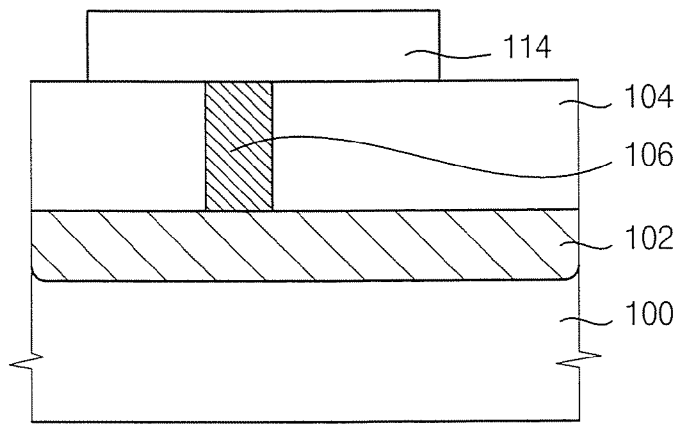

Referring to FIG. 7, the upper semiconductor layer 112 may be patterned to form upper semiconductor pattern 114 on the first insulating interlayer 104. A lower surface of the upper semiconductor pattern 114 may contact directly an upper surface of the at least one first contact plug 106.

The upper semiconductor pattern 114 may serve as an upper active region. The upper semiconductor pattern 114 may have an isolated shape. As a portion of the upper semiconductor layer 112 is removed, the upper face of the first insulating interlayer 104 may be partially exposed. The upper semiconductor patterns 114 serve as the upper active regions may be electrically insulated from each other.

Figure 8:
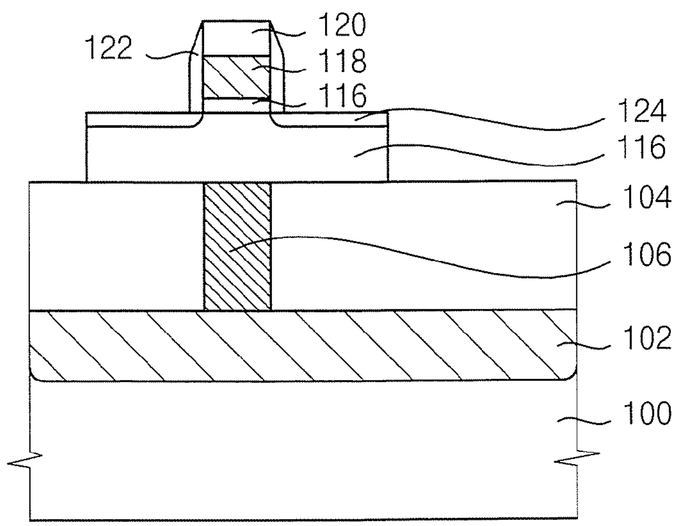

Referring to FIG. 8, an upper transistor may be formed on the upper semiconductor pattern 114.

An upper portion of the upper semiconductor pattern 114 may be oxidized to form a gate insulation layer 116. A gate conductive layer and a hard mask pattern 120 may be formed on the gate insulation layer 116. The gate conductive layer may be etched using the hard mask pattern 120 as an etching mask to form a gate electrode 118.

Impurities with a relatively low concentration may be doped into the upper semiconductor pattern 114 in both sides of the gate electrode 118 to form a low concentration impurity region (not illustrated).

An insulation layer for a spacer may be formed to cover the hard mask pattern 120, the gate electrode 118, the gate insulation layer 116 and the upper semiconductor pattern 114. The insulation layer may be anisotropically etched to form a gate spacer 122 on sidewalls of the hard mask pattern 120, the gate electrode 118 and the gate insulation layer 116.

Impurities with a relatively high concentration may be doped under the surface of the upper semiconductor pattern 114 in both sides of the spacer 122 to form a source/drain region 124. A bottom surface of the source/drain region 124 may be positioned higher than the lower surface of the upper semiconductor pattern 114.

Figure 9:
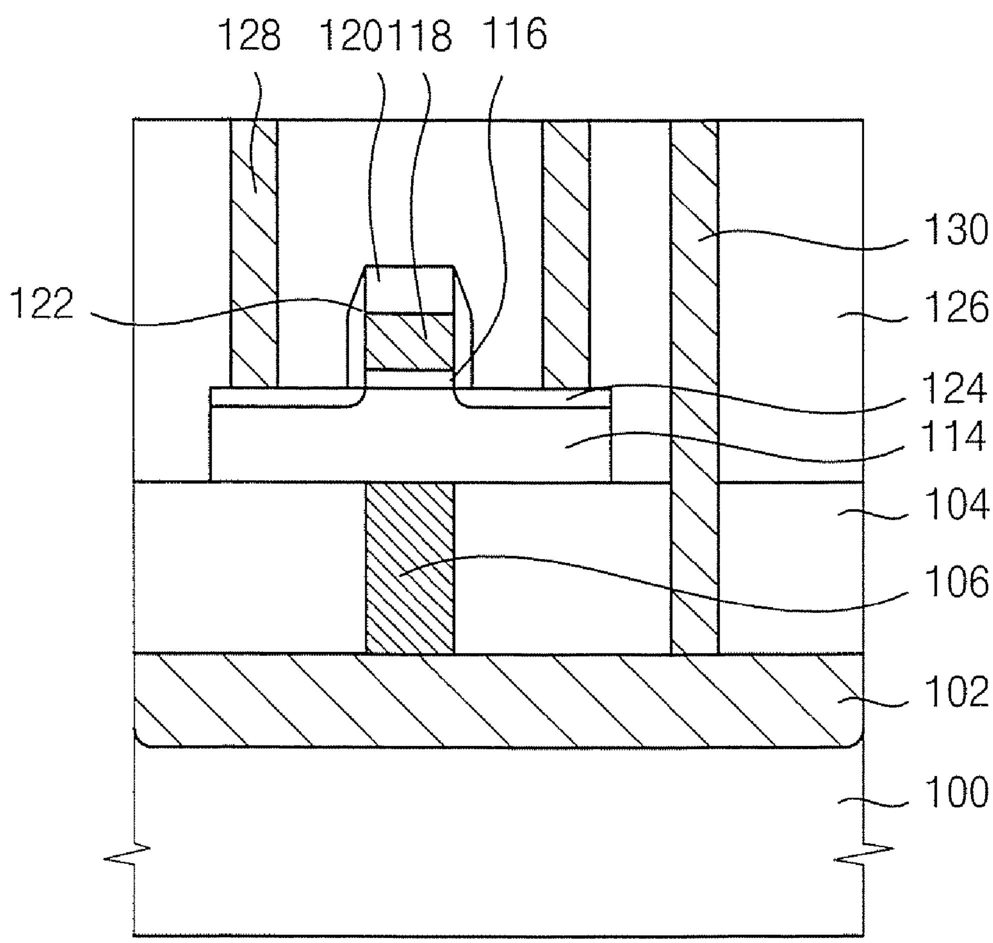

Referring to FIG. 9, a second insulating interlayer 126 may be formed to cover the upper transistor. The second insulating interlayer 126 may be formed to fill a gap between the upper semiconductor patterns 114.

A portion of the second insulating interlayer 126 may be etched to form a second contact hole exposing the source/drain region 124 of the upper transistor. The second contact hole may be filled with a conductive material and a planarization process may be performed to form a second contact plug 128.

A portion of the second insulating interlayer 126 and a portion of the first insulating interlayer 104 may be etched to form a third contact hole exposing the single-crystalline semiconductor substrate 100. The third contact hole may be formed to expose the well 102 of the single-crystalline semiconductor substrate 100. The third contact hole may be filled with a conductive material and a planarization process may be performed to form a third contact plug 130.

As described above, after forming the second contact plug 128, the third contact plug 130 may be formed. Alternatively, after forming the third contact plug 130, the second contact plug 128 may be formed. As another example, after forming the second and third contact holes, the second contact plug 128 and the third contact plug 130 may be formed simultaneously.

Then, although it is not illustrated, a conductive line (not illustrated) may be formed to be electrically connected to the third contact plug 130.

An electrical signal may be applied to the single-crystalline semiconductor substrate 100 through the third contact plug 130. The electrical signal applied to the single-crystalline semiconductor substrate 100 may be inputted to the upper semiconductor pattern 114 through the first contact plug 106. Thus, the electrical signal may be applied to a channel region of the transistor formed on the upper semiconductor pattern 114. In addition, when the transistor in the upper semiconductor pattern 114 operates, holes generated by operating the transistor may be not accumulated and may be emitted into the single-crystalline semiconductor substrate 100 to thereby prevent a failure of operation.

Embodiment 2

Figure 10:
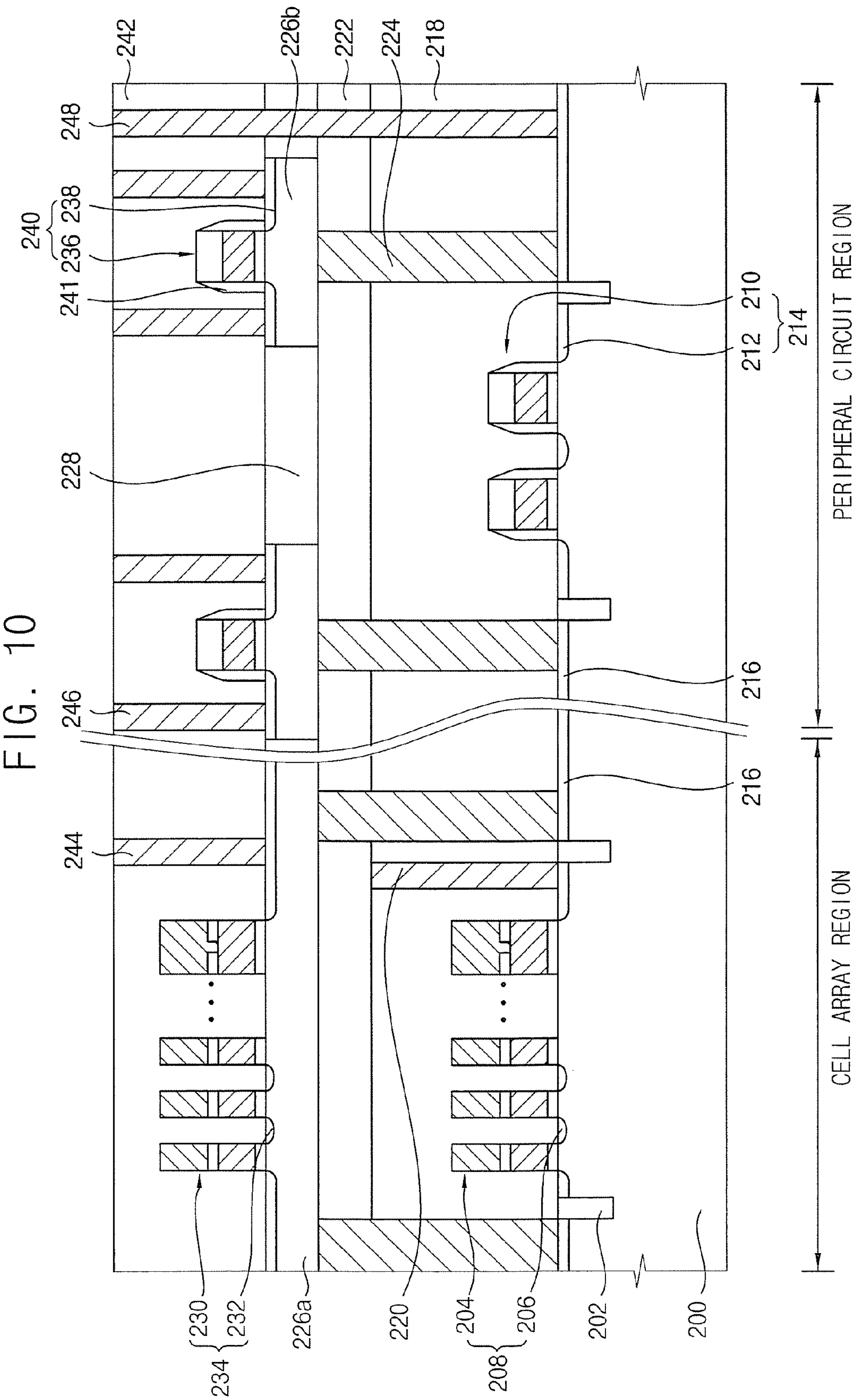
Figure 11:
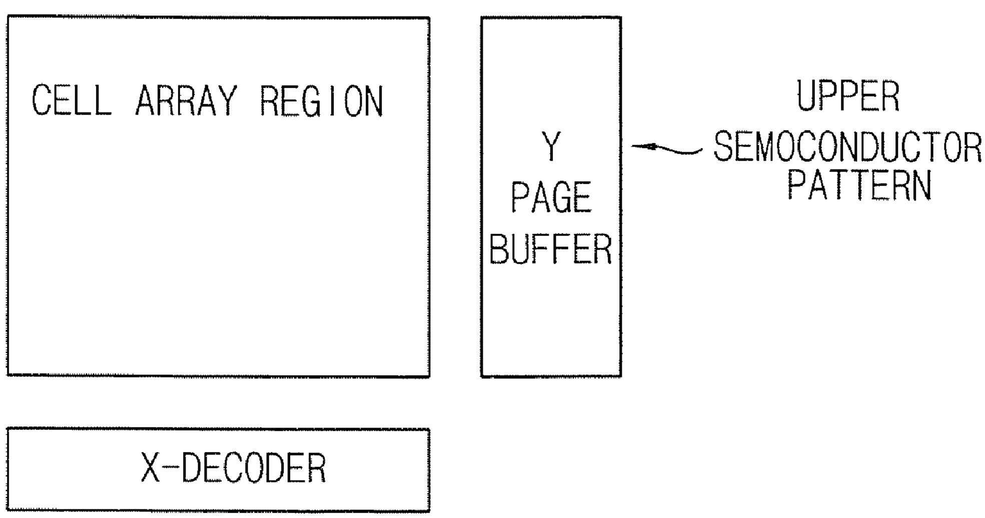

FIG. 10 is a cross-sectional view illustrating a stacked non-volatile memory device in accordance with Embodiment 2. FIG. 11 is a block diagram illustrating elements provided on the upper semiconductor pattern in FIG. 10.

Referring to FIGS. 10 and 11, a single-crystalline semiconductor substrate 200 is provided. The single-crystalline semiconductor substrate 200 may include a single-crystalline silicon substrate. A trench isolation pattern 202 is formed in the single-crystalline semiconductor substrate 200 to define an active region and an isolation region in the single-crystalline semiconductor substrate 200.

The single-crystalline semiconductor substrate 200 is divided into a cell array region and a peripheral circuit region. Cell transistors are provided in the cell array region. The cell transistor may include a first gate structure 204 and an impurity region 206. The first gate structure may have a stacked structure in which a tunnel oxide layer, a floating gate, a blocking dielectric layer and control gate are sequentially stacked. The impurity region 206 may be provided under a surface of the single-crystalline semiconductor substrate 200 in both sides of the first gate structure 204.

In addition, transistors 214 included in a peripheral circuit may be provided in the peripheral circuit region. The peripheral circuit region may include an X decoder, a Y page buffer, etc. The peripheral circuit region may include an n-type transistor, a p-type transistor. The peripheral circuit region may include a high voltage transistor or a low voltage transistor corresponding to an operation voltage. The transistor 214 included in the peripheral circuit may include a gate insulation layer and a gate electrode 210 and source/drain regions 212.

A first insulating interlayer 218 is provided to cover the transistors on the single-crystalline semiconductor substrate 200. A first contact plug 220 and a conductive line (not illustrated) may be provided in the first insulating interlayer 218 to be electrically connected to the impurity region 206 and the source/drain region 212, respectively.

A second insulating interlayer 222 is provided on the first insulating interlayer 218 to cover the first contact plug 220 and the conductive line.

A second contact plug 224 is provided to penetrate the first insulating interlayer 218 and the second insulating interlayer 222 to be electrically connected to the single-crystalline semiconductor substrate 200.

A first upper semiconductor pattern 226*a* and a second upper semiconductor pattern 226*b* are provided on the second insulating interlayer 222 to contact the second contact plug 224, respectively. The first upper semiconductor pattern 226*a* and the second upper semiconductor pattern 226*b* may have isolated shapes. An upper cell transistor 234 included in a cell array may be provided on the first upper semiconductor pattern 226*a*. An upper transistor 240 included in the peripheral circuit may be provided on the second semiconductor pattern 226*b*.

At least one the second contact plug 224 may be provided under the first upper semiconductor pattern 226*a* to be electrically connected to the single-crystalline semiconductor substrate 200. At least one the second contact plug 224 may be provided under the second upper semiconductor pattern 226*b* to be electrically connected to the single-crystalline semiconductor substrate 200. The cell transistor on the isolated first upper semiconductor pattern 226*a* may include a tunnel oxide layer, a floating gate, a blocking dielectric layer and a control gate. The first upper semiconductor pattern 226*a* may serve as an upper active region for the cell array. Thus, at least one a cell string may be provided on the first upper semiconductor pattern 226*a*. The cell string may include cell transistors serially connected to one another. The first upper semiconductor pattern 226*a* may be electrically connected to the surface of the single-crystalline semiconductor substrate 200 by the second contact plug 224. Thus, each of channel regions of the upper cell transistors 234 included in the cell string may be electrically connected to a bulk portion of the single-crystalline semiconductor substrate 200.

The upper transistor 240 on the isolated second upper semiconductor pattern 226*b* may include a gate insulation layer, a conductive layer pattern 236 and source/drain regions 238. The second semiconductor pattern 226*b* may serve as an upper active region for the peripheral circuit. Thus, transistors having a high operation voltage may be provided on the second semiconductor pattern 226*b*. The second upper semiconductor pattern 226*b* may be electrically connected to the surface of the single-crystalline substrate 200 by the second contact plug 224. Thus, a channel region of the upper transistor 240 may be electrically connected to a bulk portion of the single-crystalline semiconductor substrate 200.

An insulation layer pattern 228 is provided to fill a gap positioned between the first upper semiconductor patterns 226*a* and the second semiconductor patterns 226*b*. A third insulating interlayer 242 is provided to cover the upper transistors 234 and 240.

A third contact plug 244 is provided to penetrate the third insulating interlayer 242 to contact the impurity region of the upper cell transistor 234. A fourth contact plug 246 is provided to penetrate the third insulating interlayer 242 to contact the source/drain region of the upper transistor.

A fifth contact plug 248 is provided to penetrate the third insulating interlayer 242, insulation pattern 228, the second insulating interlayer 222 and the first insulating interlayer 218 to contact the surface of the single-crystalline semiconductor substrate 200. A conductive line (not illustrated) may be provided on the third insulating interlayer 242 to be electrically connected to the fifth contact plug 248. An electrical signal may be applied to the single-crystalline semiconductor substrate 200 through the conductive line and the fifth contact plug 248. The electrical signal applied to the single-crystalline semiconductor substrate 200 may be inputted to the upper semiconductor pattern through the second contact plug 224.

As described above, the cell array and the peripheral circuit may be provided on the upper semiconductor pattern. In the conventional stack-type semiconductor device, the cell array is positioned on the upper semiconductor pattern and the peripheral circuit for operating the cell formed on the upper semiconductor pattern is positioned on the substrate. Accordingly, the integration degree of the semiconductor device may be highly increased, compared with that of the conventional stack-type semiconductor device.

Further, electrical properties of the transistor formed on the upper semiconductor pattern may be improved since the channel region of the transistor formed on the upper semiconductor pattern is electrically connected to a bulk portion of single-crystalline semiconductor substrate.

FIGS. 12 to 19 are cross-sectional views illustrating a method of forming a stacked non-volatile memory device in accordance with Embodiment 2.

Figure 12:
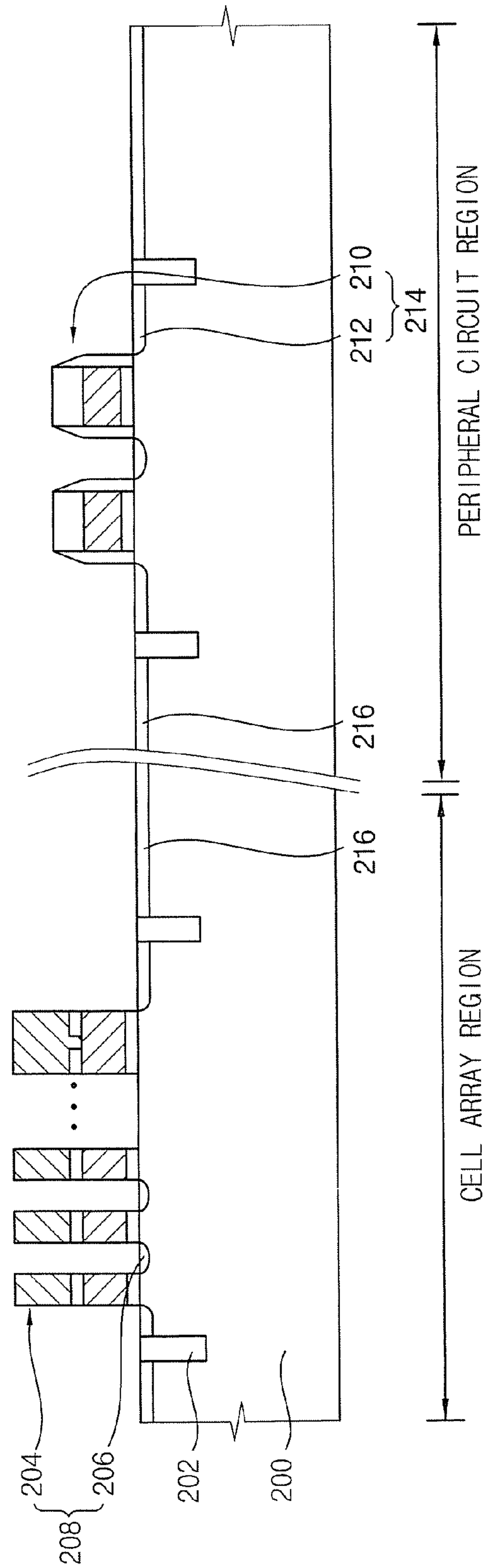

Referring to FIG. 12, a trench isolation pattern 202 is formed in a single-crystalline semiconductor substrate 200.

A cell transistor 208 is formed on a cell array region of the single-crystalline semiconductor substrate 200. The cell transistor 208 may include a first gate structure 204 and an impurity region 206. The first gate structure may have a stacked structure in which a tunnel oxide layer, a floating gate, a blocking dielectric layer and control gate are stacked on another. The impurity region 206 may be provided under the single-crystalline semiconductor substrate 200 in both sides of the first gate structures 204.

A transistor 214 included in a peripheral circuit may be formed on a peripheral circuit region. The transistor 214 may include a high voltage transistor.

A well 216 may be formed in the cell array region and the peripheral circuit region except for the impurity region 206 and source/drain regions 212. The well 216 may be doped with impurities having a conductive type opposite to that of the impurity region 206 and the source/drain regions 212.

Hereinafter, a method forming the cell transistor and the transistor included in the peripheral circuit will be described.

An impurity doping process may be performed on the single-crystalline semiconductor substrate 200 to form a well 216. A tunnel oxide layer may be formed on a surface of the single-crystalline semiconductor substrate in a cell array region. A gate insulation layer may be formed on a surface of the single-crystalline semiconductor substrate in a peripheral circuit region. The tunnel oxide layer may have a thickness substantially different from that of the gate insulation layer. Several thermal oxidation processes may be performed to form the oxide layers having different thicknesses. For example, the gate insulation layer having a relatively greater thickness may be formed on the surface of the single-crystalline semiconductor substrate in a peripheral region on which a high voltage transistor is formed.

A first conductive layer and a hard mask pattern may be formed on the oxide layers. The first conductive layer and the tunnel oxide layer may be etched using the hard mask pattern as an etching mask. The single-crystalline semiconductor substrate 200 may be etched using the hard mask pattern to form isolation trenches in the cell region and the peripheral region of the single-crystalline semiconductor substrate 200. An insulation layer may be formed on the single-crystalline semiconductor substrate 200 to fill the isolation trench, and an upper portion of the insulation layer may be removed by planarization process to form a trench isolation pattern 202.

Then, the hard mask pattern may be removed from the single-crystalline semiconductor substrate 200.

A blocking dielectric layer may be formed on the first conductive layer. A portion of the blocking dielectric layer where a selection transistor is to be formed may selectively etched in the peripheral circuit region and the cell array region.

After the portion of the blocking dielectric layer is selectively etched, a second conductive layer may be formed on the blocking dielectric layer. The second conductive layer, the blocking dielectric layer and the first conductive layer may be sequentially patterned to form a first gate structure 204. The gate structure 204 may have a stacked structure in which the tunnel oxide layer, a floating gate, the blocking dielectric layer and a control gate electrode are sequentially stacked in the cell array region. In addition, a second gate structure 210 may be formed in the peripheral circuit region. The gate insulation layer and a gate electrode may be sequentially stacked to form the second gate structure 210.

Figure 13:
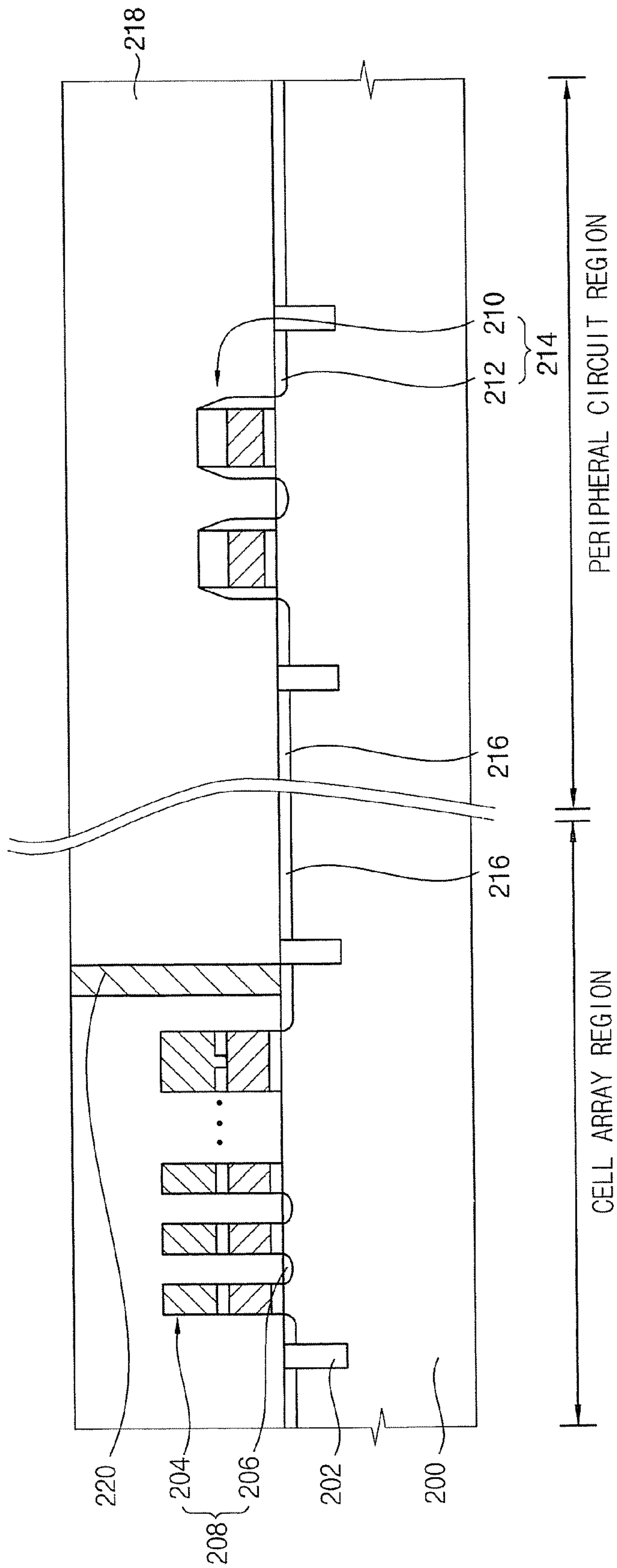

Referring to FIG. 13, a first insulating interlayer 218 is formed on single-crystalline semiconductor substrate 200. After forming the insulating interlayer 218, a CMP process may be performed to planarize an upper portion of the first insulating interlayer 218. A portion of the first insulating interlayer 218 may be etched to form a first contact hole exposing the single-crystalline semiconductor substrate 200. The first contact hole may be filled with a conductive material and a planarization process may be performed to form a first contact plug 220.

A first contact plug 220 may be electrically connected to a portion of the impurity region 206 positioned in the cell array region and a source/drain of a transistor included in a peripheral circuit, respectively.

Figure 14:
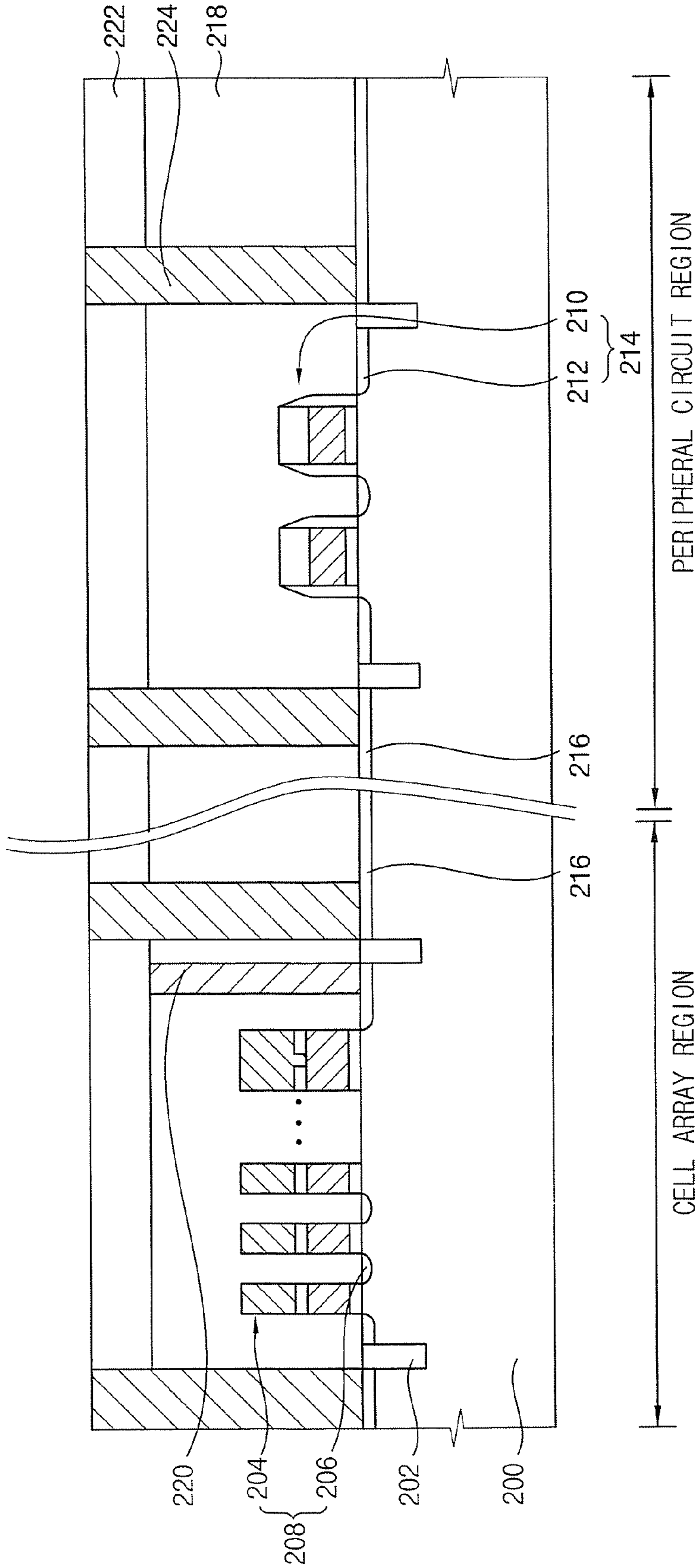

Referring to FIG. 14, a second insulating interlayer 222 is formed on the first insulating interlayer 218. A portion of the second insulating interlayer 222 may be etched to form a second contact hole exposing the single-crystalline semiconductor substrate 200. A bottom surface of the second contact hole may be exposed a portion of the well 216.

A conductive layer is deposited on the second insulating interlayer 222 to fill the second contact hole. The conductive layer may be formed using polysilicon doped with impurities, a metal and/or a metal compound. For example, a barrier metal layer including titanium (Ti)/titanium nitride (TiN) and a metal layer including tungsten (W) may be sequentially deposited to form the conductive layer. Alternatively, polysilicon doped with impurities having a conductive type the same as that of the well 216 may be deposited to form the conductive layer.

The conductive layer may be planarized to form a second contact plug 224. For example, the conductive layer may be planarized by a CMP process. The second contact plug 224 may be positioned under a first and a second semiconductor patterns to be formed by a following process in order to support the first and the second semiconductor patterns.

Figure 15:
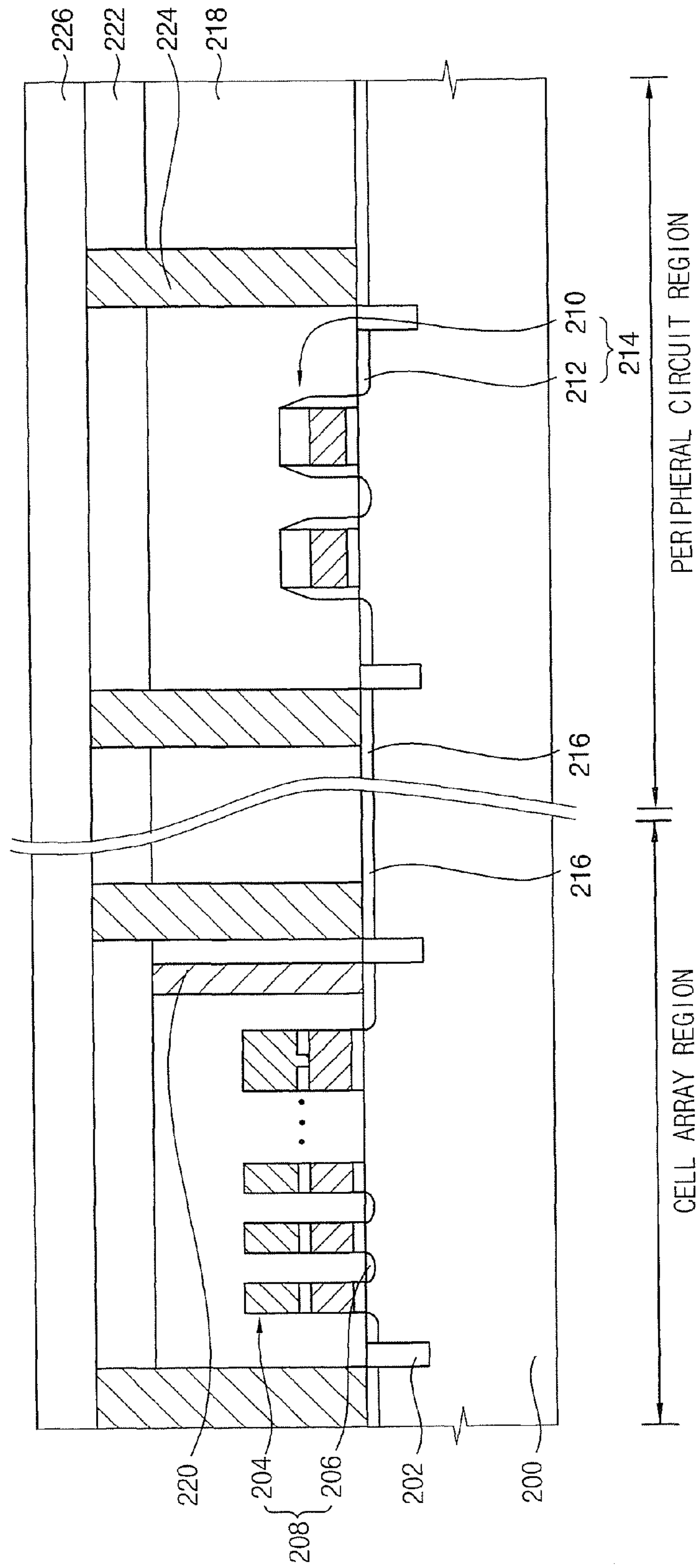

Referring to FIG. 15, an upper single-crystalline semiconductor substrate (not illustrated) may be attached to the second insulating interlayer 222. The upper single-crystalline semiconductor substrate may include single-crystalline semiconductor material. For example, the upper single-crystalline semiconductor substrate may include a single-crystalline silicon substrate. An upper portion of the upper single-crystalline semiconductor substrate may be separated from the upper single-crystalline semiconductor substrate to form a preliminary upper semiconductor layer. Explanations of a method of forming the preliminary upper semiconductor layer may be the same as those described with reference to FIG. 4, so any further explanations in these regards will be omitted herein.

A planarization process may be performed on the preliminary upper semiconductor layer to form an upper semiconductor layer 226. For example, the preliminary upper semiconductor layer 100 may be planarized by a CMP process. The upper semiconductor layer may have a flat upper surface. The upper semiconductor layer may have a thickness of about 300□ to about 4000□.

Figure 16:
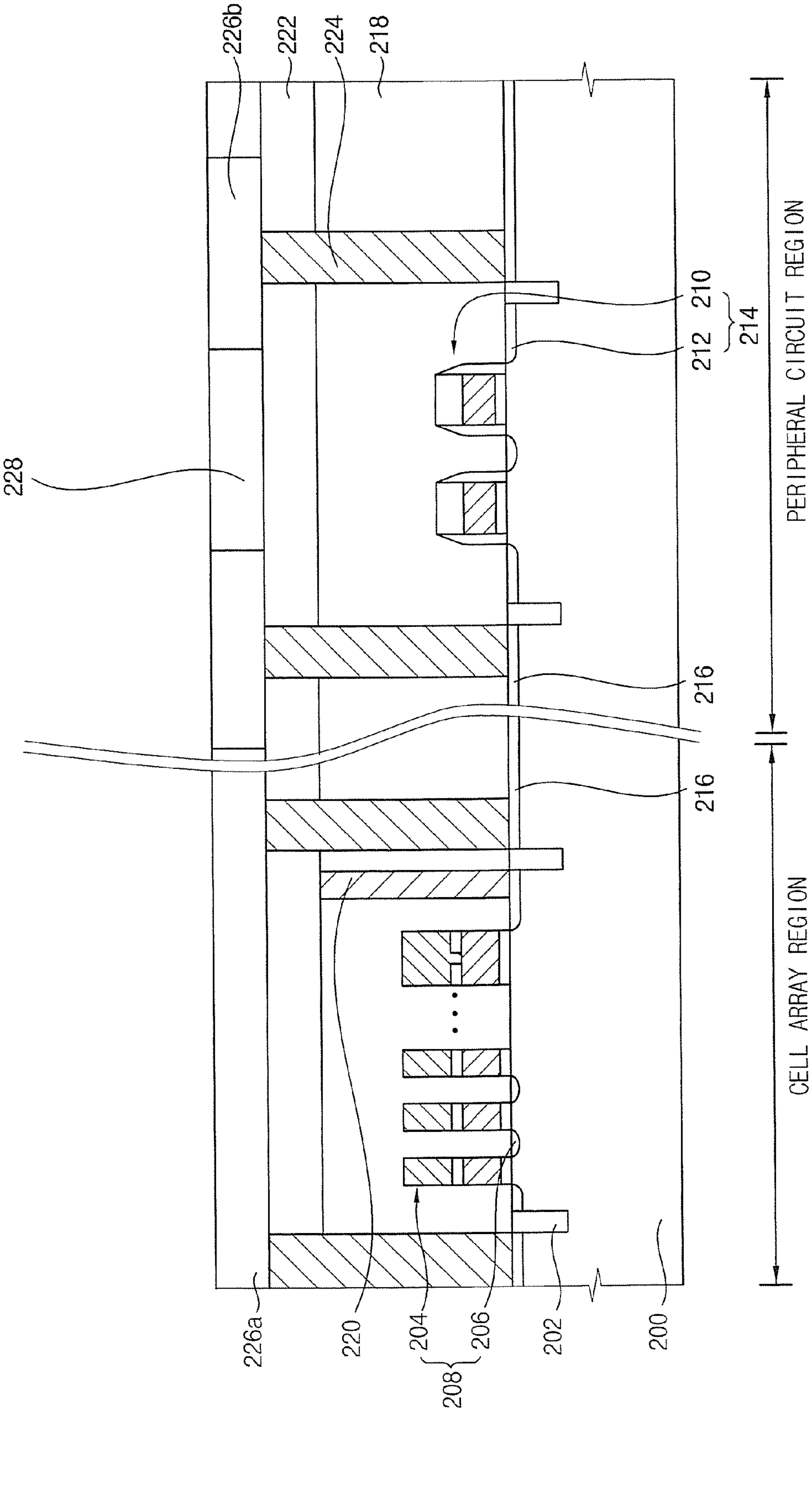

Referring to FIG. 16, the upper semiconductor layer 226 may be patterned to form upper semiconductor patterns **226*a* and 226*b* on the second insulating interlayer 222. The first upper semiconductor pattern 226*a* may serve as an active region for the upper cell array. The second semiconductor pattern 226*b*** may serve as an active region for the peripheral circuit.

At least one a second contact plug 224 may be formed under a lower surface of each of the first and the second upper semiconductor layer patterns **226*a* and 226*b*. The first and the second upper semiconductor layer patterns 226*a* and 226*b*** may have isolated shapes.

An insulation layer is formed to fill a gap positioned between the first upper semiconductor patterns **226*a* and the second semiconductor patterns 226*b*. The insulation layer may be planarized to form an insulation layer pattern 228. The isolation layer pattern 228** may be used as an isolation layer.

Figure 17:
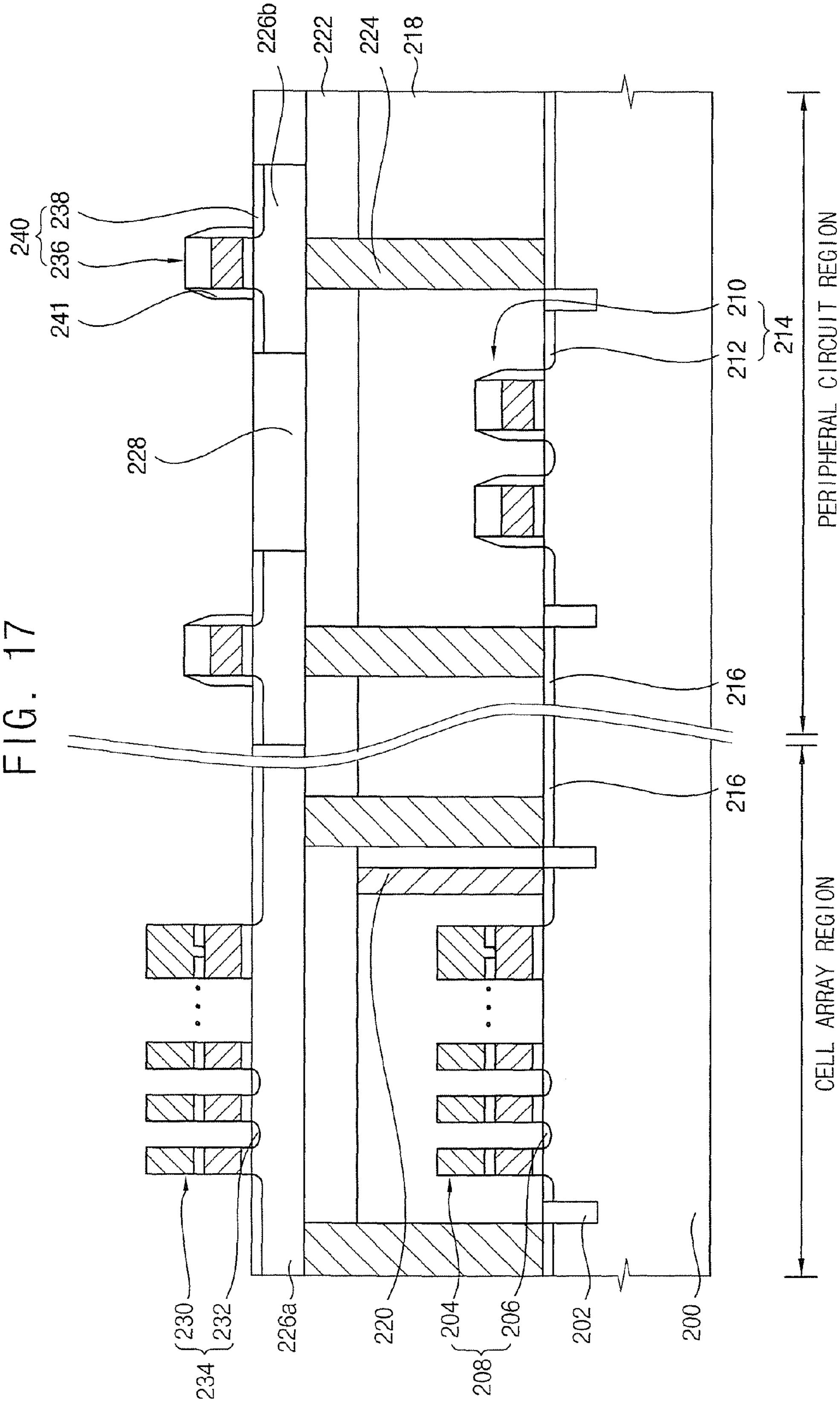

Referring to FIG. 17, an upper cell transistor 234 may be formed on the first upper semiconductor layer pattern **226*a*. An upper transistor 240 included in a peripheral circuit may be formed on the second upper semiconductor layer pattern 226*b***.

The upper cell transistor 234 may include a third gate structure 230 and an impurity region 232. The third gate structure 230 may have a stacked structure in which a tunnel oxide layer, a floating gate, a blocking dielectric layer and a control gate are sequentially stacked. The impurity region 232 may be provided under a surface of the first upper semiconductor layer pattern **226*a* in both sides of third gate structure 230. A cell string may be formed on the first upper semiconductor layer pattern 226*a*** having the isolated shape.

The upper transistor 240 included in the peripheral circuit may include a fourth gate structure 236 and a source/drain region 238. The fourth gate structure 236 may have a stacked structure in which a gate insulation layer and a gate electrode are sequentially stacked.

Hereinafter, a method forming the upper cell transistor and the upper transistor included in the peripheral circuit will be described. A tunnel oxide layer and a gate insulation layer may be formed on the first second upper semiconductor pattern **226*a* and the second upper semiconductor pattern 226*b***, respectively. The tunnel oxide layer may have a thickness substantially different from that of the gate insulation layer. Several thermal oxidation processes may be performed to form the oxide layers having different thicknesses.

A first conductive layer pattern may be formed on the tunnel oxide layer and the gate insulation layer. The blocking dielectric layer may be formed on the first conductive layer pattern. The blocking dielectric layer formed in the peripheral region and a portion of the blocking dielectric layer where a selection transistor is to be formed in the cell array region may be selectively removed. Then, a second conductive layer and a hard mask pattern may be formed. The second conductive layer may be patterned using the hard mask pattern to form the third gate structure 230 in the cell array region and the fourth gate structure 236 in the peripheral circuit region. The third gate structure 230 may have a structure substantially different from that of the fourth gate structure 236.

Impurities may be doped under the surface of the first upper semiconductor pattern 226*a* in both sides of the third gate structure 230 formed in the cell array region to form the impurity region 232. Impurities with a relatively low concentration may be doped under the surface of the second upper semiconductor pattern 232*b* in both sides of the fourth gate structure 236 formed in peripheral circuit region to form a low concentration impurity region (not illustrated).

An insulation layer for a spacer may be formed to cover the first upper semiconductor pattern 226*a*, the second upper semiconductor pattern 226*b*, the third gate structure 230 and the fourth gate structure 236. The insulation layer may be anisotropically etched to form a gate spacer 241 on sidewalls of the fourth gate structure 236.

Since a gap between the upper cell transistors 234 is relatively narrow, the gap may be filled with the insulation layer. Thus, a spacer may be not formed on sidewalls of the third gate structure 230.

After forming the spacer 241, impurities may be selectively doped under the surface of the second upper semiconductor pattern 226*b* to form a source/drain region 238.

Figure 18:
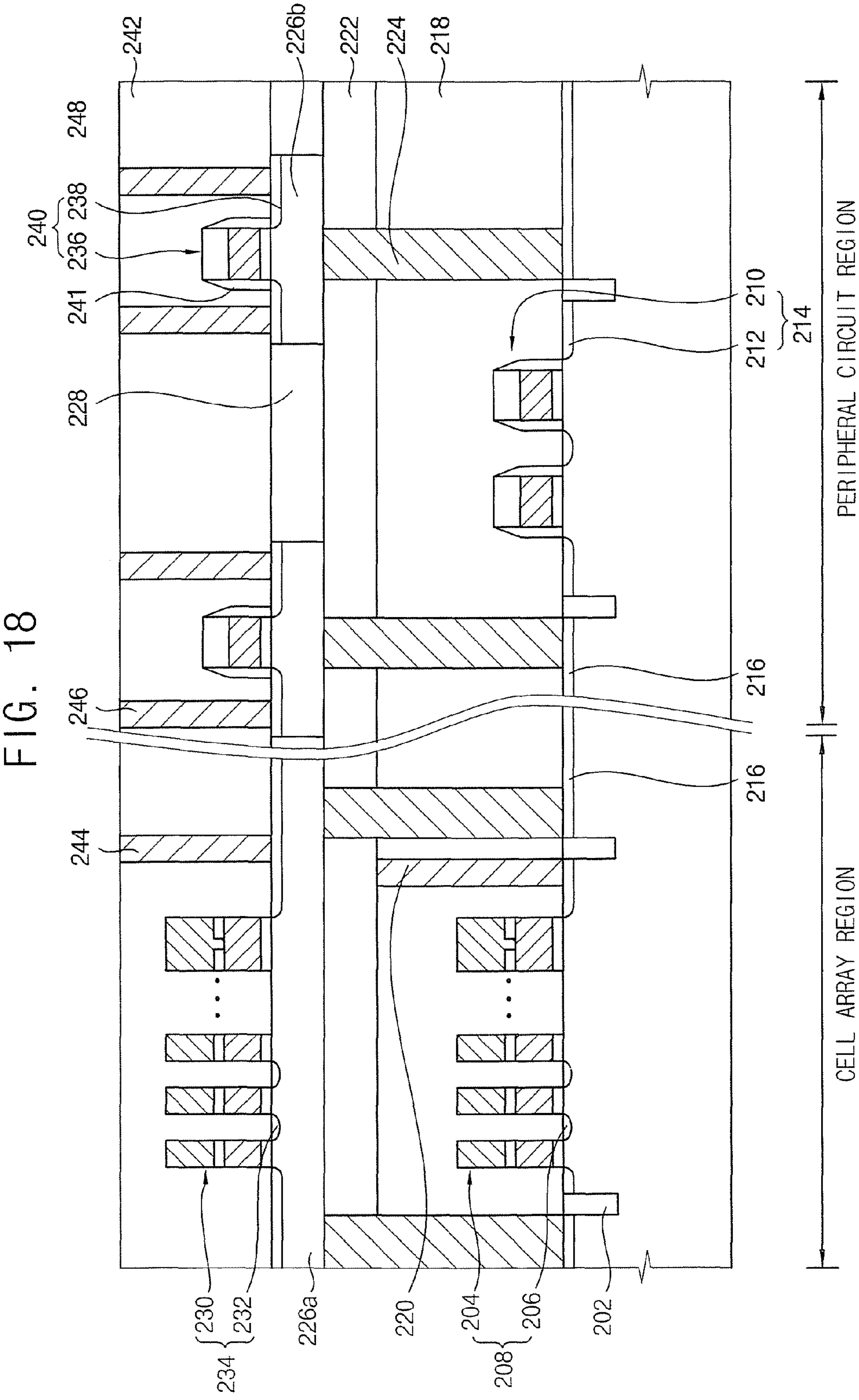

Referring to FIG. 18, a third insulating interlayer 242 is formed to cover the upper cell transistor 234 and the upper transistor 240 included in the peripheral circuit.

A portion of the third insulating interlayer 242 may be etched to form a third contact hole exposing a portion of the impurity region of the upper cell transistor 234. A portion of the third insulating interlayer 242 may be etched to form a fourth contact hole exposing the source/drain of the upper transistor 240.

A conductive layer may be formed in the third and the fourth contact holes and a planarization process may be performed to form a third contact plug 244 and a fourth contact plug 246.

Figure 19:
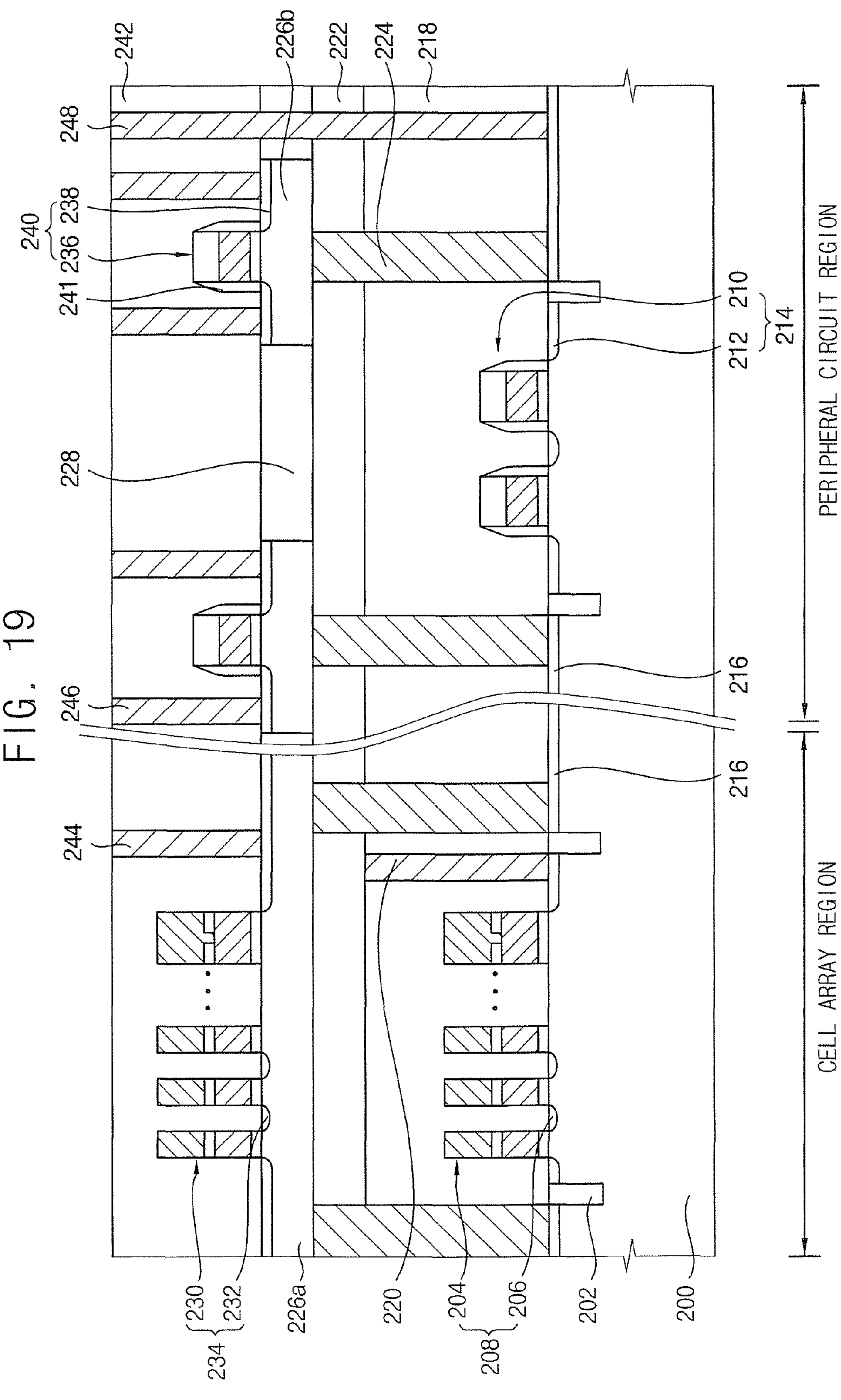

Referring to FIG. 19, a portion of the third insulating interlayer 242, the insulation pattern 228, the second insulating interlayer 222 and the first insulating interlayer 218 may be sequentially etched to form a fifth contact hole exposing a surface of the single-crystalline semiconductor substrate 200. A bottom surface of the fifth contact hole may contact the well 216 of the single-crystalline semiconductor substrate 200.

The fifth contact hole may be filled with a conductive material and a planarization process may be performed to form a fifth contact plug 248.

An electrical signal may be applied to the single-crystalline semiconductor substrate 200 through the fifth contact plug 248. The electrical signal applied to the single-crystalline semiconductor substrate 200 may be inputted to the first and the second upper semiconductor pattern 226*a* and 226*b* through the second contact plug 224. Thus, the electrical signal may be applied to channel regions of the cell transistor and the transistor included in the peripheral circuit respectively formed on the first and the second upper semiconductor pattern 226*a* and 226*b*.

Electrical properties of a high voltage transistor formed on an upper semiconductor pattern according to an example embodiment were compared with those of a high voltage transistor formed on a bulk silicon substrate. Following comparative experiments were implemented using simulation.

EXAMPLE 1

Example 1 in accordance with an example embodiment has following configurations.

A contact plug is provided on a bulk single-crystalline silicon substrate. The contact plug has a width of about 0.2 μm and a height of about 0.5 μm. An upper single-crystalline silicon pattern is provided to contact an upper face of the contact plug. The upper single-crystalline silicon pattern has a height of about 3000□. A high voltage transistor is provided on the upper single-crystalline silicon pattern.

COMPARATIVE EXAMPLE 1

In Comparative Example 1, a high voltage transistor is provided on a bulk single-crystalline silicon substrate.

The high voltage transistor Comparative Example 1 has configurations substantially the same as those of Example 1. In other words, a length of a gate structure, a thickness of a gate insulation layer and a height, a resistance and a doping concentration of a gate electrode in the high voltage transistor in Comparative Example 1 are substantially the same as those in Example 1.

Evaluation of Pass Characteristics

An output source voltage of the high voltage transistor of Example 1 corresponding to an input gate voltage and an input drain voltage was simulated. In other words, when Vpp was applied to the gate and the drain in the high voltage transistor of Example 1, the output source voltage corresponding to the Vpp was simulated.

Also, an output source voltage of the high voltage transistor of Comparative Example 1 corresponding to an input gate voltage and an input drain voltage was simulated. In other words, when the Vpp was applied to the gate and the drain in the high voltage transistor of Comparative Example 1, the output source voltage corresponding to the Vpp was simulated.

Figure 20:
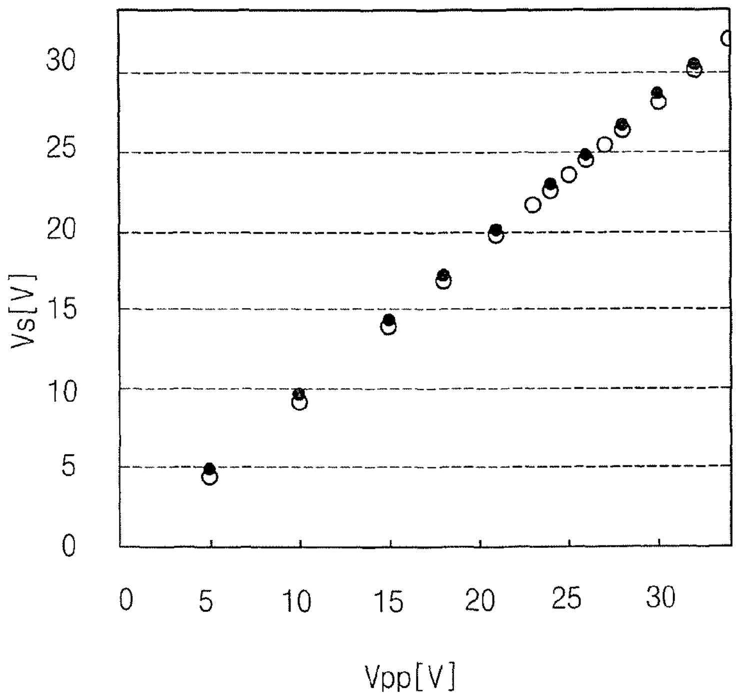
FIG. 20 is graphs respectively showing the output source voltages in accordance with the input gate voltages and the input drain voltages in the high voltage transistor of Example 1 and the high voltage transistor of Comparative Example 1.

FIG. 20 is graphs respectively showing the output source voltages in accordance with the input gate voltages and the input drain voltages in the high voltage transistor of Example 1 and the high voltage transistor of Comparative Example 1.

In FIG. 20, the points "○" on the graph show simulation results in the high voltage transistor of Comparative Example 1 and the points "●" on the graph show simulation results in the high voltage transistor of Example 1.

Referring to FIG. 20, the high voltage transistor formed on the upper single-crystalline silicon pattern according to Example 1 showed pass characteristics substantially the same as those of the high voltage transistor formed on the bulk single-crystalline silicon substrate according to Comparative Example 1.

As a result, it was confirmed that the high voltage transistor formed on the upper single-crystalline silicon pattern according to example embodiments has electrical properties substantially the same as those of the high voltage transistor formed on the bulk single-crystalline silicon substrate. Further, it was confirmed that a voltage drop in the high voltage transistor of Example 1 hardly occur on condition that the high voltage transistor is in a turn-on state.

Evaluation of a drain current-gate voltage (Id-Vg) characteristics

An output drain current of the high voltage transistor of Example 1 corresponding to an input gate voltage was simulated as the gate voltage increases gradually. Also, the output drain current of Comparative Example 1 corresponding to the input gate voltage of the high voltage transistor was simulated as the gate voltage increases gradually.

Figure 21:
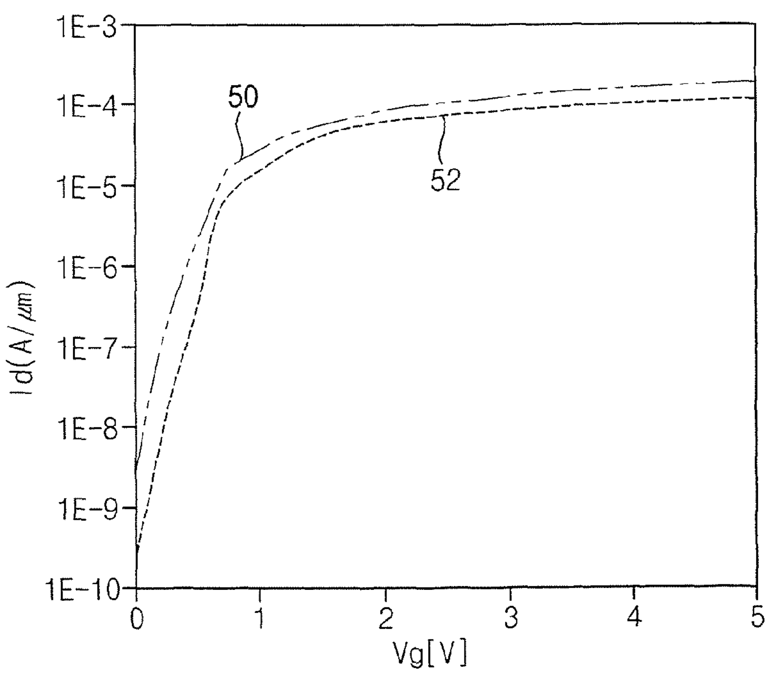
FIG. 21 is graphs respectively showing Id-Vg curves of the high voltage transistor of Example 1 and the high voltage transistor of Comparative Example 1.

FIG. 21 is graphs respectively showing Id-Vg curves of the high voltage transistor of Example 1 and the high voltage transistor of Comparative Example 1.

In FIG. 21, the reference numeral "50" in the graph is representative of simulation results in the high voltage transistor of Example 1. The reference numeral "52" in the graph is representative of simulation results in the high voltage transistor of Comparative Example 1.

Referring to FIG. 21, the high voltage transistor formed on the upper single-crystalline silicon pattern according to Example 1 showed substantially Id-Vg characteristics the same as those of the high voltage transistor formed on the bulk single-crystalline silicon substrate according to Comparative Example 1.

As a result, it was confirmed that the high voltage transistor formed on the upper single-crystalline silicon pattern according to example embodiments has electrical properties substantially the same as those of the high voltage transistor formed on the bulk single-crystalline silicon substrate.

According to example embodiments, the types of the semiconductor device may be not limited and may be variously employed on condition of a vertically stack-type semiconductor device.

As one example, a dynamic random access memory (DRAM) cell may be formed on a cell array region in a memory device according to Embodiment 2 to form a DRAM device. As another example, a static random access memory (SRAM) cell may be formed on a cell array region in a memory device according to Embodiment 2 to form a SRAM device.

In addition, a stack-type semiconductor device according to example embodiments may be widely employed in various applications, e.g., a memory controller, a computer central processing unit (CPU), a mobile electronic appliance, etc.

According to example embodiments, a bulk portion of an upper semiconductor pattern is electrically connected to a single-crystalline semiconductor substrate. Since the upper semiconductor pattern is not electrically separated, a deterioration of unit elements by self heating of the unit elements may be prevented during operating the unit elements provided on the upper semiconductor pattern. Thus, electrical properties of the unit elements provided on the upper semiconductor pattern may be improved.

In addition, a peripheral circuit including a high voltage transistor may be formed on the upper semiconductor pattern. Thus, it is possible to modify various configurations of the stack-type semiconductor device.

Further, since each of the upper semiconductor patterns may have an isolated pattern shape, it is possible to electrically isolate each of the upper semiconductor patterns even though the upper semiconductor pattern is spaced apart from adjacent upper semiconductor patterns at a relatively narrow distance. Thus, the stack-type semiconductor device according to the example embodiment may have high integration degree.

As described above, the stack-type semiconductor device according to example embodiments may be widely employed in a memory device and a logic device in which high integration degree and high-capacity data storage has been required.

The foregoing is illustrative of example embodiments and is to not be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is to not be construed as limited to the specific example embodiments disclosed, and that modifications to the disclosed example embodiments, as well as other example embodiments, are intended to be included within the scope of the appended claims.

What is claimed is:

1. An stack-type semiconductor device, comprising:

a first insulating interlayer on a single-crystalline semiconductor substrate;

a first contact plug penetrating the first insulating interlayer to contact the single-crystalline semiconductor substrate;

an upper semiconductor pattern including an active region and an impurity region on the first insulating interlayer, an upper surface of the first contact plug contacting a lower surface of the active region of the upper semiconductor pattern;

a second insulating interlayer covering the upper semiconductor pattern;

a second contact plug penetrating the second insulating interlayer to be electrically connected to the impurity region of the upper semiconductor pattern;

a third contact plug penetrating the first and second insulating interlayers and contacting the single-crystalline semiconductor substrate; and a gate structure positioned adjacent to the impurity region on the upper semiconductor pattern.

2. The stack-type semiconductor device of claim 1, wherein a plurality of the upper semiconductor patterns are provided and an insulation layer is interposed between the upper semiconductor patterns.

3. The stack-type semiconductor device of claim 1, wherein cell transistors are provided on the single-crystalline semiconductor substrate to serve as a cell array.

4. The stack-type semiconductor device of claim 1, further comprising an upper transistor included in a peripheral circuit on the upper semiconductor pattern, wherein the upper transistor includes an impurity region and a gate structure.

5. The stack-type semiconductor device of claim 4, wherein the upper transistor has an operating voltage substantially different from that of a cell transistor.

6. The stack-type semiconductor device of claim 1, further comprising a first lower transistor serving as a cell array and a second lower transistor serving as a peripheral circuit on the single-crystalline semiconductor substrate.

7. The stack-type semiconductor device of claim 1, wherein a plurality of the upper semiconductor patterns are provided, and an upper transistor provided on the upper semiconductor pattern includes a first upper transistor serving as a cell array and a second upper transistor serving as a peripheral circuit.

8. The stack-type semiconductor device of claim 1, further comprising a wiring electrically connected to the single-crystalline semiconductor substrate such that an electrical signal is applied to the upper semiconductor pattern through the first contact plug.

9. The stack-type semiconductor device of claim 1, wherein the first contact plug comprises polysilicon doped with impurities, metal and metal compound.

10. The stack-type semiconductor device of claim 1, wherein the upper semiconductor pattern comprises single-crystalline semiconductor material.

11. The stack-type semiconductor device of claim 1, further comprising:

a plurality of upper semiconductor patterns on the first insulating interlayer; and a plurality of contact plugs penetrating the first insulating interlayer to contact the single-crystalline semiconductor substrate, wherein a lower surface of each of the plurality of upper semiconductor patterns contacts an upper surface of a respective one of the plurality of contact plugs.

12. A non-volatile memory device, comprising:

a semiconductor substrate having a first string of NAND-type memory cells therein;

a first interlayer insulating layer on said semiconductor substrate;

a single-crystal semiconductor layer on said first interlayer insulating layer, said single-crystal semiconductor layer having an active region and a second string of NAND-type memory cells therein extending opposite the first string of NAND-type memory cells;

a first electrically conductive contact plug extending through said first interlayer insulating layer, an upper surface of said first electrically conductive contact plug contacting a lower surface of the active region of said single-crystal semiconductor layer such that said first electrically conductive contact plug electrically connects a region in said semiconductor substrate to a region in said single-crystal semiconductor layer:

a second interlayer insulating layer covering said single-crystal semiconductor layer;

a second electrically conductive contact plug penetrating said second interlayer insulating layer to be electrically connected to an impurity region of said single-crystal semiconductor layer; and a third electrically conductive contact plug penetrating said first and second interlayer insulating layers and contacting said semiconductor substrate.

13. The memory device of claim 12, wherein said first electrically conductive contact plug electrically shorts said semiconductor substrate to said single-crystal semiconductor layer.

* * * * *